(12) United States Patent
Terazawa

(10) Patent No.: US 7,152,195 B2
(45) Date of Patent: Dec. 19, 2006

(54) SCAN TEST CIRCUIT

(75) Inventor: Toshihiro Terazawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 360 days.

(21) Appl. No.: 10/761,286

(22) Filed: Jan. 22, 2004

(65) Prior Publication Data
US 2005/0138510 A1 Jun. 23, 2005

(30) Foreign Application Priority Data
Nov. 20, 2003 (JP) ............................. 2003-391100

(51) Int. Cl.
*G01R 31/28* (2006.01)
(52) U.S. Cl. .................... 714/726; 714/724
(58) Field of Classification Search ............ None
See application file for complete search history.

(56) References Cited
U.S. PATENT DOCUMENTS 4,856,002 A * 8/1989 Sakashita et al. ............ 714/731
5,329,532 A * 7/1994 Ikeda et al. .................. 714/731
6,134,688 A * 10/2000 Sachdev ...................... 714/727
6,189,115 B1* 2/2001 Whetsel ........................ 714/28
6,189,128 B1* 2/2001 Asaka ............................ 716/4
6,708,303 B1* 3/2004 Gallia ......................... 714/726
2004/0237015 A1* 11/2004 Abdel-Hafez et al. ...... 714/726

FOREIGN PATENT DOCUMENTS

JP    2002-289776    10/2002

* cited by examiner

*Primary Examiner*—Phung My Chung
(74) *Attorney, Agent, or Firm*—Oblon, Spivak, McClelland, Maier & Neustadt, P.C.

(57) ABSTRACT

The scan test circuit according to one embodiment of the present invention includes a noninversion/inversion control circuit inserted and connected between a sequential circuit and a combinational circuit included in a path to be subjected to a scan test, the noninversion/inversion control circuit not inverting or inverting scan data output from the sequential circuit, on outside of said sequential circuit at arbitrary timing.

20 Claims, 3 Drawing Sheets

SCAN TEST CIRCUIT

CROSS REFERENCE TO RELATED APPLICATION

The subject application is related to subject matter disclosed in Japanese Patent Application No. 2003-391100 filed on Nov. 20, 2003 in Japan to which the subject application claims priority under Paris Convention and which is incorporated herein by reference.

BACKGROUND OF THE INVENTION

1. Field of the Invention

The present invention relates to a test circuit for semiconductor integrated circuit, and in particular to a scan test circuit that conducts a scan test on a semiconductor integrated circuit at its actual operation speed (at-speed scan test circuit).

2. Related Background Art

As means to detect failures or troubles in the chip manufacturing process for semiconductor integrated circuits, importance of at-speed test, in which a test for a semiconductor integrated circuit is conducted at the actual operation speed of the circuit, has increased. Especially, if the at-speed test can be executed in a scan test, in which the failure detection factor can be improved easily, failures or troubles in the chip manufacturing process can be detected with a considerable probability.

One of scan test circuits that are the most practical in implementing the at-speed scan test in the background art is a scan test circuit formed of two-phase clocked sequential circuits.

In the case of a scan test circuit formed of two-phase clocked sequential circuits, however, there is a problem. If data that is the same as data one cycle before is input from a sequential circuit to a combinational circuit included in a path to be subjected to scan test at the time of scan shift, i.e., at a rising edge of a scan clock pulse, the at-speed scan test can not be implemented.

In other words, the same data is input from the sequential circuit to the combinational circuit from one cycle earlier. Even if it is attempted to increase the speed of the clocked operation and analyze the signal propagation in the path to be analyzed at the actual operation speed, the path is judged to have apparently passed the test if an output having a proper value has arrived at an output node of the combinational circuit within a time corresponding to two cycles.

Therefore, the conventional scan test circuit formed of two-phase clocked sequential circuits has a problem that a correct test result sometimes cannot be obtained.

Another scan test circuit having a possibility that the at-speed scan test can be implemented in the background art is a scan test circuit formed of one-phase clocked sequential circuits.

FIG. 1 is a block diagram of a conventional scan test circuit formed of one-phase clocked sequential circuits. In FIG. 1, only components of three lines each including a combinational circuit of one stage are shown.

The conventional scan test circuit formed of one-phase clocked sequential circuits includes cascade-connected first sequential circuit S1, first combinational circuit C1 and second sequential circuit S2, cascade-connected third sequential circuit S3, second combinational circuit C2 and fourth sequential circuit S4, and cascade-connected fifth sequential circuit S5, third combinational circuit C3 and sixth sequential circuit S6.

A scan input TI of the third sequential circuit S3 disposed at the top of the second line is supplied with an output Q or an inverted output QN of the first sequential circuit S1 disposed at the top of the first line. A scan input TI of the fifth sequential circuit S5 disposed at the top of the third line is supplied with an output Q or an inverted output QN of the third sequential circuit S3 disposed at the top of the second line.

In FIG. 1, the case where the scan inputs TI of the third sequential circuit S3 and the fifth sequential circuit S5 are supplied respectively with the inverted outputs QN of the first sequential circuit S1 and the third sequential circuit S3 is shown as an example.

Furthermore, in the example shown in FIG. 1, the output Q of the third sequential circuit S3 is input to the first combinational circuit C1. An output Q of the fifth sequential circuit S5 is input to the second combinational circuit C2.

FIG. 2 is a timing chart of the scan clock in the conventional scan test circuit formed of one-phase clocked sequential circuits.

In a scan test in the above-described conventional scan test circuit, shift data supplied from a shift data input/output port I/O are set in the first sequential circuit S1, the third sequential circuit S3 and the fifth sequential circuit S5 at scan shift timing, which is a rising edge of the scan clock, and scan data corresponding to the shift data are input from the first sequential circuit S1, the third sequential circuit S3 and the fifth sequential circuit S5 to the first combinational circuit C1, the second combinational circuit C2 and the third combinational circuit C3, respectively.

Output data that are consequently output from the first combinational circuit C1, the second combinational circuit C2 and the third combinational circuit C3 are captured by a second sequential circuit S2, a fourth sequential circuit S4 and a sixth sequential circuit S6 at a rising edge of the scan clock in a subsequent repetition period. As a result, operations of the first combinational circuit C1, the second combinational circuit C2 and the third combinational circuit C3 are evaluated.

As heretofore described, several scan test circuits formed of one-phase clocked sequential circuits have been proposed. An example thereof is described in, for example, Japanese Patent Laid-Open Publication No. 2002-289776.

In the case where a scan test circuit is formed of one-phase clocked sequential circuits, however, a scan mode of a system clock is used as the scan clock supplied to the sequential circuits at the time of the scan test. Therefore, repetition periods of the scan clock, i.e., periods A, B and C shown in FIG. 2 are always fixed (to for example, 30 ns).

In order to implement the at-speed scan test, therefore, there is no other way than making the scan clock frequency higher.

Even if the scan clock frequency is made high, however, it is also necessary to set the shift data from the shift data input/output port I/O at high speed in order to implement the at-speed scan test.

Among testers used in the scan test to set the shift data, however, a tester having an operation clock frequency that is as high as the clock frequency in the actual operation speed of semiconductor integrated circuits to be tested is very expensive.

Heretofore, therefore, practical use of the at-speed scan test circuits has been considered to be difficult.

SUMMARY OF THE INVENTION

According to a basic configuration of one embodiment of the present invention, there is provided with a scan test circuit comprising a noninversion/inversion control circuit inserted and connected between a sequential circuit and a combinational circuit included in a path to be subjected to a scan test, the noninversion/inversion control circuit not inverting or inverting scan data output from said sequential circuit, on outside of said sequential circuit at arbitrary timing.

According to a detailed configuration of one embodiment of the present invention, there is provided with a scan test circuit comprising: a first sequential circuit, with shift data corresponding to output data to be observed being set in the first sequential circuit by a scan shift conducted one repetition period before capture of the output data and scan data corresponding to the shift data being output by the first sequential circuit; a noninversion/inversion control circuit, which does not invert or inverts the scan data output from the first sequential circuit, on outside of the first sequential circuit at arbitrary timing; a combinational circuit included in a path to be subjected to scan test, and supplied with scan data obtained by non-inverting or inverting the scan data by means of the noninversion/inversion control circuit; and a second sequential circuit to capture output data output from the combinational circuit according to the scan data.

DETAILED DESCRIPTION OF THE EMBODIMENTS

Hereafter, embodiments of a scan test circuit according the present invention will be described with reference to the drawings.

Figure 3:
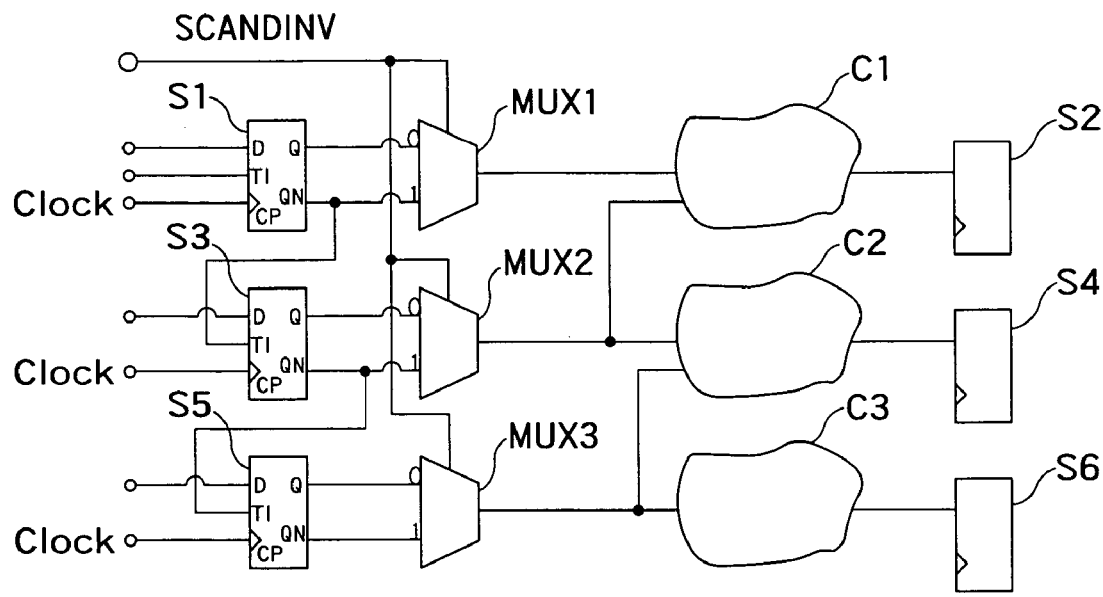
FIG. 3 is a block diagram of a scan test circuit according to a first embodiment of the present invention.

FIG. 3 is a block diagram of a scan test circuit according to a first embodiment of the present invention. In FIG. 3, only components of three lines each including a combinational circuit of one stage are shown.

The scan test circuit according to the first embodiment of the present invention is a scan test circuit formed of one-phase clocked sequential circuits. Between sequential circuits and combinational circuits included in paths to be subjected to scan test, multiplexers are inserted and connected respectively as non-inversion/inversion control circuits not to invert or to invert scan data output from the sequential circuits on the outside of the sequential circuits at arbitrary timing.

Specifically, the scan test circuit according to the first embodiment of the present invention includes cascade-connected first sequential circuit S1, first multiplexer MUX1, first combinational circuit C1 and second sequential circuit S2, cascade-connected third sequential circuit S3, second multiplexer MUX2, second combinational circuit C2 and fourth sequential circuit S4, and cascade-connected fifth sequential circuit S5, third multiplexer MUX3, third combinational circuit C3 and sixth sequential circuit S6.

A scan input TI of the third sequential circuit S3 disposed at the top of the second line is supplied with an output Q or an inverted output QN of the first sequential circuit S1 disposed at the top of the first line. A scan input TI of the fifth sequential circuit S5 disposed at the top of the third line is supplied with an output Q or an inverted output QN of the third sequential circuit S3 disposed at the top of the second line.

In FIG. 3, the case where the scan inputs TI of the third sequential circuit S3 and the fifth sequential circuit S5 are supplied respectively with the inverted outputs QN of the first sequential circuit S1 and the third sequential circuit S3 is shown as an example.

Two data inputs of the first multiplexer MUX1, the second multiplexer MUX2 and the third multiplexer MUX3 are supplied with outputs Q and inverted outputs QN of the first sequential circuit S1, the third sequential circuit S3 and the fifth sequential circuit S5, respectively. Select inputs of the first multiplexer MUX1, the second multiplexer MUX2 and the third multiplexer MUX3 are supplied with a control signal SCANDINV.

Each of the multiplexers selectively outputs one of the output Q or the inverted output QN to the first combinational circuit C1, the second combinational circuit C2 or the third combinational circuit C in the subsequent stage according to the control signal SCANDINV.

As a result, each multiplexer functions as a non-inversion/inversion control circuit not to invert or to invert scan data, which is output from the sequential circuit in a preceding stage, on the outside of the sequential circuit at arbitrary timing.

Furthermore, in FIG. 3, an output of the second multiplexer MUX2 is input to the first combinational circuit C1, and an output of the third multiplexer MUX3 is input to the second combinational circuit C2.

In the scan test circuit according to the first embodiment of the present invention, a multiplexer serving as a non-inversion/inversion control circuit is thus inserted and connected between a sequential circuit and a combinational circuit included in a path to be subjected to scan test. As a result, it is possible to obtain an effect similar to that obtained by arbitrarily controlling the data transfer time between the sequential circuits in the stage preceding the combinational circuits and the sequential circuits in the stage subsequent to the combinational circuits.

Therefore, it becomes possible to execute the at-speed scan test without depending upon the frequency of the scan clock, which drives the sequential circuits.

Figure 4:
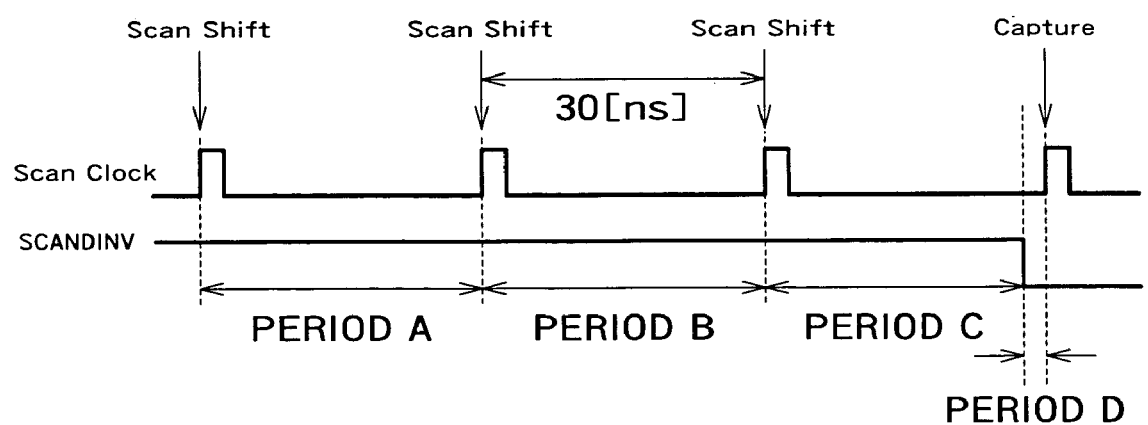
FIG. 4 is a timing chart of a scan clock and a control signal SCANDINV in a scan test circuit according to the first embodiment of the present invention.

FIG. 4 is a timing chart of the scan clock and the control signal SCANDINV in the scan test circuit according to the first embodiment of the present invention. The function and operation of the scan test circuit according to the first embodiment of the present invention will be concretely described while comparing them with those of the conventional scan test circuit shown in FIG. 1.

One-phase clocked sequential circuits are used as the sequential circuits. Supposing that the repetition period of the scan clock supplied to the sequential circuits is 30 ns, therefore, the time between a scan shift to input scan data corresponding to output data to be observed and capture of the output data is also 30 ns, and the length of the time cannot be altered.

Figure 1:
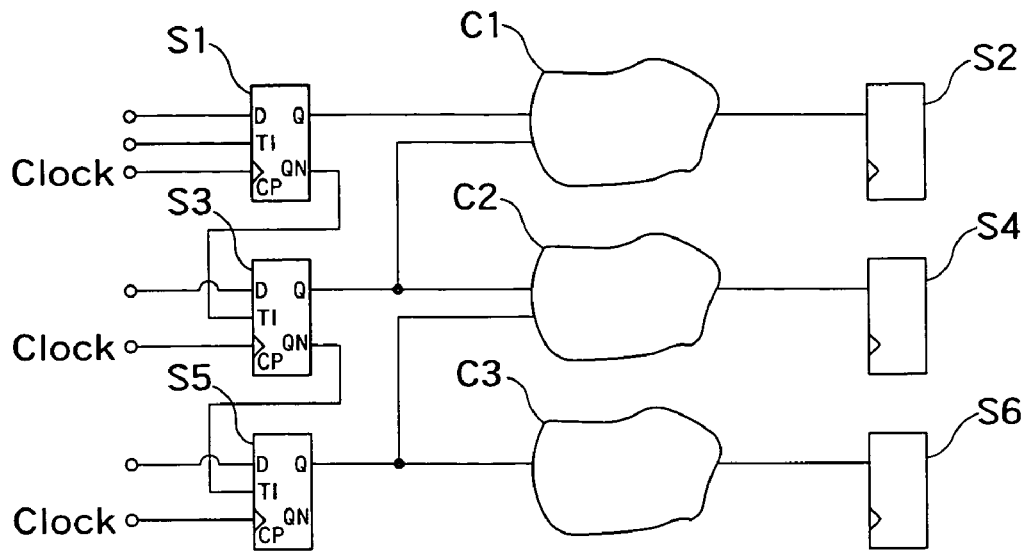
FIG. 1 is a block diagram of a conventional scan test circuit formed of one-phase clocked sequential circuits.
Figure 2:
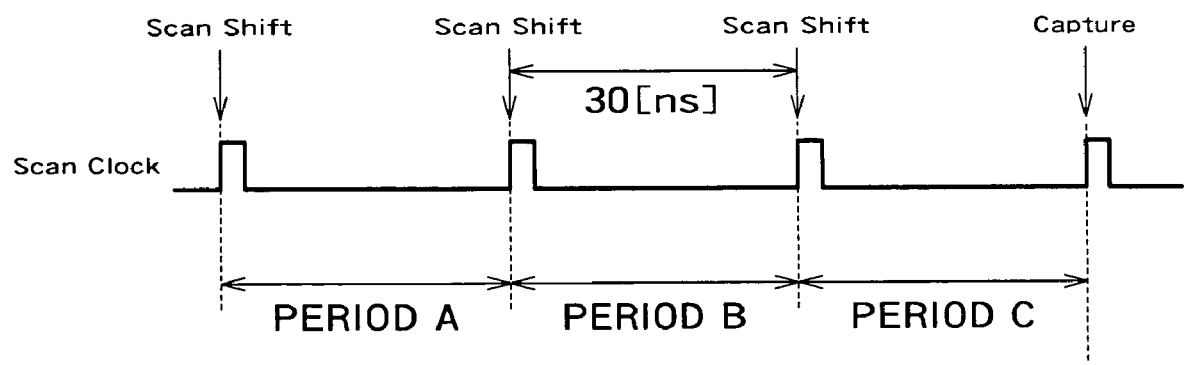
FIG. 2 is a timing chart of a scan clock in a conventional scan test circuit formed of one-phase clocked sequential circuits.

In the case of the conventional scan test circuit shown in FIG. 1, therefore, there is no other way than making the scan clock frequency higher in order to implement the at-speed scan test. Even if the scan clock frequency is made high, it is also necessary to supply the shift data from the shift data input/output port I/O at high speed by using an expensive tester in order to implement the at-speed scan test, as described above. Execution of the at-speed scan test is difficult.

On the other hand, in the scan test circuit according to the first embodiment of the present invention, a multiplexer serving as a non-inversion/inversion control circuit is thus inserted and connected between a sequential circuit and a combinational circuit included in a path to be subjected to scan test. Even if the time between a scan shift to input scan data corresponding to output data to be observed and capture of the output data (period C+period D), i.e., the repetition period of the shift clock is 30 ns, therefore, the timing of switching the value of the scan data supplied from the multiplexers to the combinational circuits can be arbitrarily controlled by the control signal SCANDINV.

In the scan test circuit according to the first embodiment of the present invention, therefore, the period D between the timing of switching the value of the scan data supplied to the combinational circuits and capture of output data of the combinational circuits can be shortened remarkably as compared with the repetition period of the scan clock, and the at-speed scan test can be executed.

For example, when executing the at-speed scan test for a path between the first sequential circuit S1 and the second sequential circuit S2 via the first multiplexer MUX1 and the first combinational circuit C1, shift data corresponding to output data to be observed in the second sequence circuit S2 is set in the first sequential circuit S1 in a scan shift of one repetition period before the capture in the second sequential circuit S2 (i.e., a scan shift at start time of the period C), and scan data corresponding to the set shift data are input from the first sequential circuit S1 to two data inputs of the first multiplexer MUX1 as an output Q and an inverted output QN.

Over the period C, however, the control signal SCAND-INV input to a select input of the first multiplexer MUX1 is at an H (High) level, and consequently the first multiplexer MUX1 inverts the scan data output from the first sequential circuit S1 and outputs a result. In other words, the first multiplexer MUX1 selects an inverted output QN, which is inverted data of the scan data, from an output Q and the inverted output QN of the first sequential circuit S1, and outputs the inverted output QN to the first combinational circuit C1.

And the period C finishes and the period D is started, and the control signal SCANDINV is switched from the H level to an L (Low) level. From that point in time, the first multiplexer MUX1 outputs the scan data output from the first sequential circuit S1 in a non-inverted state. In other words, the first multiplexer MUX1 selects the output Q, which is non-inverted data of the scan data, from the output Q and the inverted output QN, and outputs the output Q to the first combinational circuit C1.

The period D between the timing of switching of the control signal SCANDINV from the H level to the L level and the capture becomes the time actually taken to propagate the data signal to be observed.

The length of the period D can be arbitrarily altered by controlling the timing of the switching of the control signal SCANDINV.

According to the configuration of the scan test circuit according to the first embodiment of the present invention, the at-speed scan test can be executed without depending upon the frequency of the scan clock, which drives the sequential circuits.

When executing the at-speed scan test by using the scan test circuit according to the first embodiment of the present invention as described above, the length of the period D shown in FIG. 4 cannot be estimated unless the clock delay between a clock supply external terminal used to supply the clock to each sequential circuit and a clock input of each sequential circuit, and a signal delay between a control signal supply external terminal used to supply the control signal SCANDINV to each multiplexer and the select input of each multiplexer can be calculated.

The above-described disadvantage can be eliminated by conducting CTS (Clock Tree Synthesis) processing so as to cause state transition simultaneously in the clock supply external terminal and the clock input of each sequential circuit and conducting CTS processing in the same way so as to cause state transition simultaneously in the control signal supply external terminal and the select input of each multiplexer.

Owing to this CTS processing, the time difference between the timing of the supply of the clock to each sequential circuit and the timing of the supply of the control signal SCANDINV to each multiplexer can be found by observing the clock supply external terminal and the control signal supply external terminal. Thus, it becomes possible to accurately control the length of the period D so as to make it equal to the desired time interval on the test. By the way, this CTS processing can also be applied to other embodiments described later.

Figure 5:
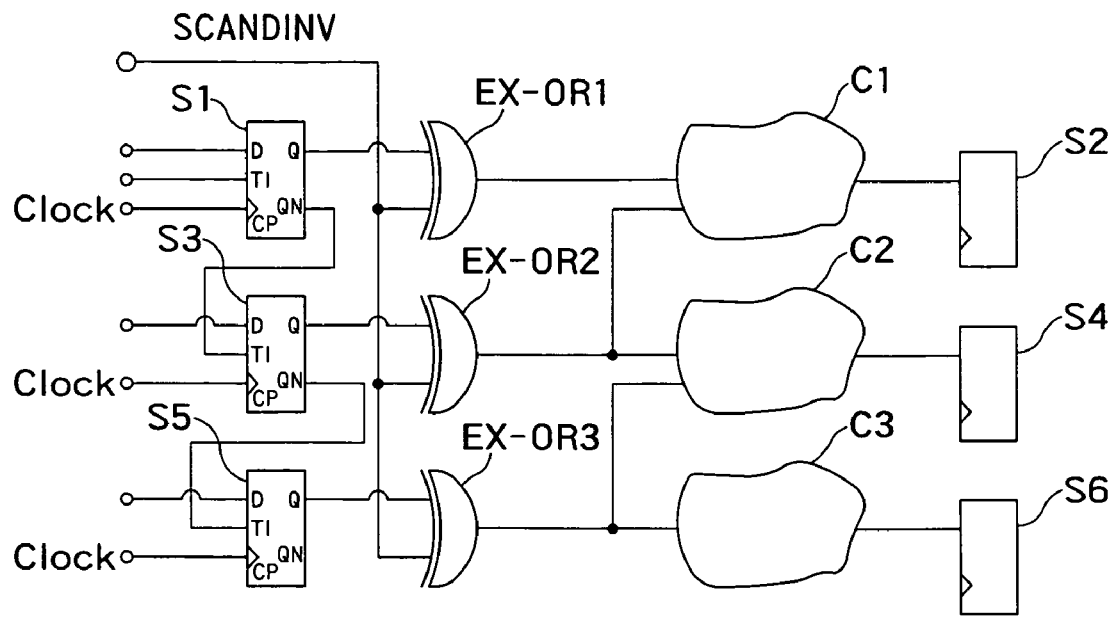
FIG. 5 is a block diagram of a scan test circuit according to a second embodiment of the present invention.

FIG. 5 is a block diagram of a scan test circuit according to a second embodiment of the present invention. In FIG. 5, only components of three lines each including a combinational circuit of a single stage.

In the scan test circuit according to the first embodiment of the present invention shown in FIG. 3, a multiplexer is inserted and connected as the non-inversion/inversion control circuit not to invert or to invert the scan data, which is output from a sequential circuit, on the outside of the sequential circuit at arbitrary timing. On the other hand, in the scan test circuit according to the second embodiment of the present invention shown in FIG. 5, an exclusive OR gate circuit is inserted and connected as the non-inversion/inversion control circuit instead of the multiplexer.

Specifically, the scan test circuit according to the second embodiment of the present invention includes cascade-connected first sequential circuit S1, first exclusive OR gate circuit EX-OR1, first combinational circuit C1 and second sequential circuit S2, cascade-connected third sequential circuit S3, second exclusive OR gate circuit EX-OR2, second combinational circuit C2 and fourth sequential circuit S4, and cascade-connected fifth sequential circuit S5, third exclusive OR gate circuit EX-OR3, third combinational circuit C3 and sixth sequential circuit S6.

And a scan input TI of the third sequential circuit S3 disposed at the top of the second line is supplied with an output Q or an inverted output QN of the first sequential circuit S1 disposed at the top of the first line, and a scan input TI of the fifth sequential circuit S5 disposed at the top of the third line is supplied with an output Q or an inverted output QN of the third sequential circuit S3 disposed at the top of the third line.

In FIG. 5, the case where the inverted outputs QN of the first sequential circuit S1 and the third sequential circuit S3 are respectively input to scan inputs TI of the third sequential circuit S3 and the fifth sequential circuit S5 is shown as an example.

Each of the first exclusive OR circuit EX-OR1, the second exclusive OR circuit EX-OR2 and the third exclusive OR circuit EX-OR3 is a two-input exclusive OR gate circuit. First inputs of them are supplied with outputs Q of the first sequential circuit S1, the third sequential circuit S3 and the fifth sequential circuit S5, respectively. Second inputs of the first to third exclusive OR circuits EX-OR1, EX-OR2 and EX-OR3 are supplied with the control signal SCANDINV.

And the exclusive OR gate circuits do not invert or invert the output Q according to the control signal SCANDINV, and output results to the first combinational circuit C1, the second combinational circuit C2 and the third combinational circuit C3 in the subsequent stage, respectively.

As a result, each exclusive OR gate circuit functions as a noninversion/inversion control circuit not to invert or to invert the scan data, which is output from the sequential circuit in the preceding stage, on the outside of the sequential circuit at arbitrary timing.

Furthermore, in FIG. 5, an output of the second exclusive OR gate circuit EX-OR2 is input to the first combinational circuit C1, and an output of the third exclusive OR gate circuit EX-OR3 is input to the second combinational circuit C2.

In the scan test circuit according to the second embodiment of the present invention as well, exclusive OR gate circuits serving as noninversion/inversion control circuits are inserted and connected between the sequential circuits and the combinational circuits included in the path to be subjected to the scan test. As a result, it is possible to obtain an effect similar to that obtained by arbitrarily controlling the data transfer time between the sequential circuits in the stage preceding the combinational circuits and the sequential circuits in the stage subsequent to the combinational circuits.

Therefore, it becomes possible to execute the at-speed scan test without depending upon the frequency of the scan clock, which drives the sequential circuits.

Figure 6:
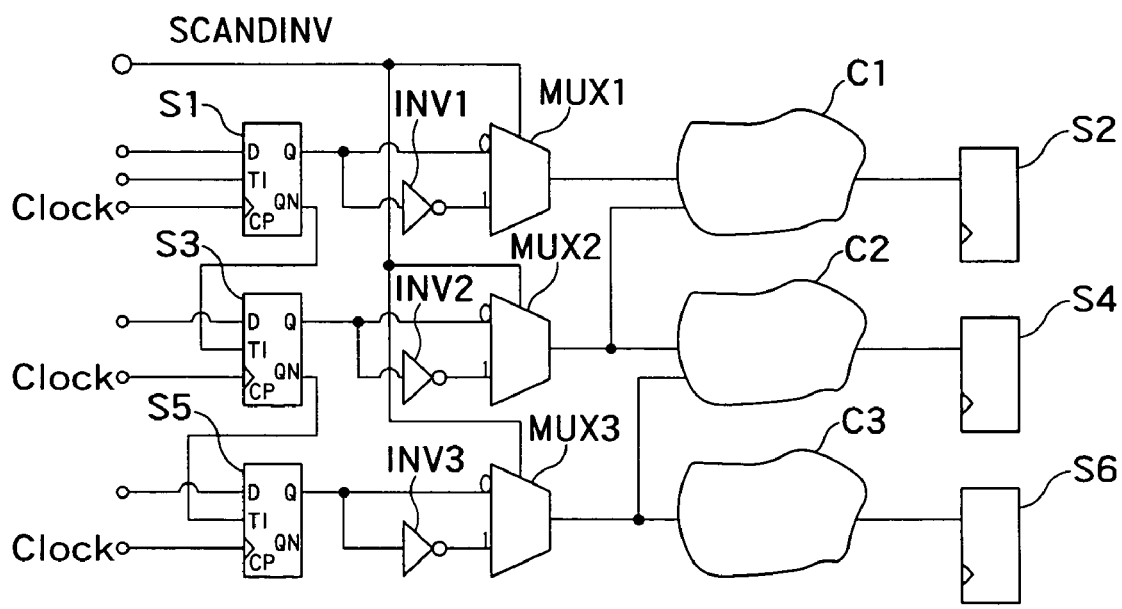
FIG. 6 is a block diagram of a scan test circuit according to a third embodiment of the present invention.

FIG. 6 is a block diagram of a scan test circuit according to a third embodiment of the present invention. In FIG. 6, only components of three lines each including a combinational circuit of a single stage.

In the scan test circuit according to the first embodiment of the present invention shown in FIG. 3, the outputs Q and the inverted output QN corresponding to the scan data, which are output from each of the sequential circuits, are input directly to two data inputs of the corresponding multiplexer. On the other hand, in the scan test circuit according to the third embodiment of the present invention shown in FIG. 6, the output Q corresponding to the scan data, which is output from each of the sequential circuits, is input directly to a first input of the corresponding multiplexer. The output Q is inverted by an inverter and the inverted Q is input to a second input of the multiplexer.

Except this point, the scan test circuit according to the third embodiment of the present invention has a configuration that is completely the same as that of the scan test circuit according to the first embodiment of the present invention.

In the scan test circuit according to the third embodiment of the present invention as well, therefore, an effect similar to that of the scan test circuit according to the first embodiment of the present invention can be obtained.

In the foregoing description of the embodiments of the scan test circuit according to the present invention heretofore described, the sequential circuits are one-phase clocked sequential circuits. Also in the case where the sequential circuits are two-phase clocked sequential circuits, it is possible to implement the at-speed scan test by using the configuration of the embodiments of the scan test circuit according to the present invention.

In addition, if the configuration of each embodiment of the scan test circuit is used, it becomes possible to implement the at-speed test also for an ordinary function test other than the scan test.

Typically, in order to implement the at-speed function test, it becomes necessary to activate the internal clock at a high frequency by using a PLL circuit or a DLL circuit.

If the configuration of each embodiment of the scan test circuit according to the present invention is used, the at-speed function test can be implemented by control using the control signal SCANDINV, even if a high frequency clock is not generated by the PLL circuit or the DLL circuit.

According to the scan test circuit according to an embodiment of the present invention, the noninversion/inversion control circuit is inserted and connected between the sequential circuit and the combinational circuit included in a path to be subjected to the scan test, and the noninversion/inversion control circuit does not invert or inverts the scan data, which is output from the sequential circuit, on the outside of the sequential circuit at arbitrary timing. As a result, the at-speed scan test can be executed simply and at low cost.

The present invention can be applied to a test circuit for semiconductor integrated circuits, and in particular to an at-speed scan test circuit, which conducts the scan test of a semiconductor integrated circuit at an actual operation speed of the circuit.

What is claimed is:

1. A scan test circuit comprising a noninversion/inversion control circuit inserted and connected between a sequential circuit and a combinational circuit included in a path to be subjected to a scan test, said noninversion/inversion control circuit not inverting or inverting scan data output from said sequential circuit, on outside of said sequential circuit at arbitrary timing.

2. The scan test circuit according to claim 1, wherein said sequential circuit is a circuit that outputs the scan data as non-inverted data and inverted data, said noninversion/inversion control circuit being a multiplexer that outputs selectively the non-inverted data or inverted data of the scan data according to a noninversion/inversion control signal, which is input from outside.

3. The scan test circuit according to claim 1, further comprising an inverter to generate inverted data of the scan data output from said sequential circuit, said noninversion/inversion control circuit being a multiplexer that outputs selectively the non-inverted data or inverted data of the scan data according to a noninversion/inversion control signal, which is input from outside.

4. The scan test circuit according to claim 1, wherein said noninversion/inversion control circuit is a two-input exclusive OR gate circuit supplied at a first input thereof with the scan data output from said sequential circuit and supplied at a second input thereof with a noninversion/inversion control signal.

5. The scan test circuit according to claim 1, wherein said sequential circuit is a one-phase clocked sequential circuit.

6. The scan test circuit according to claim 1, wherein said sequential circuit is a two-phase clocked sequential circuit.

7. The scan test circuit according to claim 1, wherein said noninversion/inversion control circuit does not invert or inverts the scan data according to a noninversion/inversion control signal, which is input from outside.

8. The scan test circuit according to claim 7, wherein said sequential circuit is a circuit that outputs the scan data as non-inverted data and inverted data, said noninversion/inversion control circuit being a multiplexer that outputs selectively the non-inverted data or inverted data of the scan data according to a noninversion/inversion control signal, which is input from outside.

9. The scan test circuit according to claim 8, wherein said sequential circuit is a two-phase clocked sequential circuit.

10. The scan test circuit according to claim 7, further comprising an inverter to generate inverted data of the scan data output from said sequential circuit, said noninversion/inversion control circuit being a multiplexer that outputs selectively the non-inverted data or inverted data of the scan data according to a noninversion/inversion control signal, which is input from outside.

11. The scan test circuit according to claim 7, wherein said noninversion/inversion control circuit is a two-input exclusive OR gate circuit supplied at a first input thereof with the scan data output from said sequential circuit and supplied at a second input thereof with a noninversion/inversion control signal.

12. The scan test circuit according to claim 7, wherein said sequential circuit is a one-phase clocked sequential circuit.

13. A scan test circuit comprising:
a first sequential circuit, with shift data corresponding to output data to be observed being set in said first sequential circuit by a scan shift conducted one repetition period before capture of the output data and scan data corresponding to the shift data being output by said first sequential circuit;
a noninversion/inversion control circuit, which does not invert or inverts the scan data output from said first sequential circuit, on outside of said first sequential circuit at arbitrary timing;
a combinational circuit included in a path to be subjected to scan test, and supplied with the scan data obtained by non-inverting or inverting the scan data by means of said noninversion/inversion control circuit; and
a second sequential circuit to capture output data output from said combinational circuit according to the scan data.

14. The scan test circuit according to claim 13, wherein said noninversion/inversion control circuit does not invert or inverts the scan data according to a noninversion/inversion control signal, which is input from outside.

15. The scan test circuit according to claim 13, wherein said first sequential circuit is a circuit that outputs the scan data as non-inverted data and inverted data, said noninversion/inversion control circuit being a multiplexer that outputs selectively the non-inverted data or inverted data of the scan data according to a noninversion/inversion control signal, which is input from outside.

16. The scan test circuit according to claim 13, further comprising an inverter to generate inverted data of the scan data output from said first sequential circuit, said noninversion/inversion control circuit being a multiplexer that outputs selectively the non-inverted data or inverted data of the scan data according to a noninversion/inversion control signal, which is input from outside.

17. The scan test circuit according to claim 13, wherein said noninversion/inversion control circuit is a two-input exclusive OR gate circuit supplied at a first input thereof with the scan data output from said first sequential circuit and supplied at a second input thereof with a noninversion/inversion control signal.

18. The scan test circuit according to claim 13, wherein CTS (Clock Tree Synthesis) processing is conducted so as to cause state transition simultaneously in a clock supply external terminal used to supply a clock to each of said sequential circuits and a clock input of the corresponding sequential circuit, and CTS processing is conducted so as to cause state transition simultaneously in a control signal supply external terminal used to supply the noninversion/inversion control signal to said noninversion/inversion control circuit and a noninversion/inversion control signal input of said noninversion/inversion control circuit.

19. The scan test circuit according to claim 13, wherein said first and second sequential circuits are one-phase clocked sequential circuits.

20. The scan test circuit according to claim 13, wherein said first and second sequential circuits are two-phase clocked sequential circuits.

* * * * *